(12) United States Patent
Nakamura et al.

(10) Patent No.: US 6,369,424 B1
(45) Date of Patent: Apr. 9, 2002

(54) FIELD EFFECT TRANSISTOR HAVING HIGH BREAKDOWN WITHSTAND CAPACITY

(75) Inventors: Hideyuki Nakamura; Nobuki Miyakoshi, both of Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 09/595,910

(22) Filed: Jun. 20, 2000

(30) Foreign Application Priority Data

Jun. 24, 1999 (JP) .............................. 11-177950

(51) Int. Cl.$^7$ .............................................. H01L 29/76
(52) U.S. Cl. ...................... 257/339; 257/341; 257/342; 257/408; 257/409; 257/490; 257/491; 257/494; 257/495; 438/282; 438/284; 438/286; 370/445; 370/901; 709/107
(58) Field of Search ................................ 257/408, 409, 257/339, 341, 342, 494, 495, 491, 490; 370/445, 901; 709/107; 438/282, 284, 286

(56) References Cited

U.S. PATENT DOCUMENTS 3,391,287 A 7/1968 Kao et al.
4,567,502 A 1/1986 Nakagawa et al. ............ 357/53
4,789,882 A 12/1988 Lidow ........................ 357/23.4
4,959,699 A 9/1990 Lidow et al. ............... 357/23.7
5,747,853 A 5/1998 So et al. ...................... 257/355

Primary Examiner—Tom Thomas
Assistant Examiner—Donghee Kang
(74) Attorney, Agent, or Firm—Armstrong, Westerman & Hattori, LLP.

(57) ABSTRACT

A field effect transistor having a high breakdown withstand capacity is provided. An active region 7a is surrounded by a fixed potential diffusion layer 16, and a channel region 15 is formed in the active region 7a. A gate pad 35 is provided outside the fixed potential diffusion layer 16. Minority carriers injected at a peripheral region of the active region 7a flow into the fixed potential diffusion layer 16, which prevents breakdown attributable to concentration of the carriers. The fixed potential diffusion layer 16 is surrounded by a plurality of guard ring diffusion layers $17_1$ through $17_4$, and a pad diffusion layer 18 formed in a position under the gate pad 35 is connected to the innermost guard ring diffusion layer $17_1$. Since this encourages expansion of a depletion layer under the gate pad 35, an increased breakdown voltage is provided.

9 Claims, 6 Drawing Sheets

FIELD EFFECT TRANSISTOR HAVING HIGH BREAKDOWN WITHSTAND CAPACITY

BACKGROUND OF THE INVENTION

1. Field of the Invention

The present invention relates to field effect transistors and, more particularly, to a technique for improving the breakdown withstand capacity of a field effect transistor.

1. Prior Art

Reference number 101 in FIG. 10 represents a MOSFET according to the related art. In the MOSFET 101, an $n^-$-type silicon single crystal is grown on an epitaxial basis on a surface of an $n^+$-type silicon single crystal substrate 105 to form a drain layer 111. A p-type base diffusion layer 112 is formed in the drain layer 111 through a photolithographic step and a diffusion step.

An $n^+$-type source region 114 is formed in the base diffusion layer 112, and a channel region 115 is formed between a peripheral portion of the base diffusion layer 112 and a peripheral portion of the source region 114 on the top surface of the drain region 111.

The base diffusion layer 112 has a square configuration, and a plurality of base diffusion layers 112 are provided on the top surface of the drain layer 111 such that the sides thereof face each other.

A gate oxide film 121 is formed on a surface of the channel region 115, and a gate electrode film 131 is formed on a surface of the gate oxide film 121.

A source electrode film 132 is formed on the base diffusion layer 112 and source region 114. The source electrode film 132 and gate electrode film 131 are insulated from each other by a layer insulation film 122.

When the source electrode film 132 is formed, a gate pad 135 is formed simultaneously. The gate pad 135 is isolated from the source electrode film 132 and is connected to the gate electrode film 131. The MOSFET 101 is encapsulated in a resin package. One end of a bonding wire is connected to the gate pad 135 which is thereby extended to the outside of the package as a gate terminal.

A drain electrode film 133 is formed on the back surface of the drain layer 111. The source electrode film 132 and drain electrode film 133 are also extended to the outside as a source terminal and a drain terminal, respectively.

In the MOSFET 101 having the above-described structure, when a positive voltage is applied to the gate electrode film 131 with the source electrode film 132 grounded and a positive voltage applied to the drain electrode film 133, an n-type inversion layer is formed on a surface of the channel region 115; the source region 114 and drain layer 111 are connected by the inversion layer; and a current flows from the drain electrode film 133 to the source electrode film 132.

Then, the inversion layer vanishes when the voltage at the gate electrode film 132 approaches the ground potential, and this cuts off the current.

In general, a parasitic diode is formed by a p-n junction between the drain layer 111 and base diffusion layer 112. When the potential of the source electrode film 132 is higher than that of the drain electrode film 133, the parasitic diode is forward-biased to cause a current to flow from the source electrode film 132 to the drain electrode film 133.

When a current flows through a parasitic diode as described above, minority carriers are injected into the drain layer 111. When the parasitic diode is reverse-biased from the forward-biased state, the minority carriers that have been injected into the drain layer 111 flow into the base diffusion layer 112, which may cause breakdown of a region outside the periphery of an active region 141 because no base diffusion layer exists in that region.

SUMMARY OF THE INVENTION

The present invention was conceived to solve the above described problem with the related art, and it is an object of the invention to provide a field effect transistor having a high breakdown withstand capacity.

In order to solve the above-described problem, according to the present invention, there is provided a field effect transistor having: a substrate of one conductivity type; a drain region of the same conductivity type as that of the substrate, provided on the substrate; a fixed potential diffusion layer of a conductivity type different from that of the drain layer, in the form of a ring provided inside the drain layer and on the side of a top surface thereof; an active region which is a part of the drain layer and which is a region located inside the fixed potential diffusion layer in the drain layer; a base diffusion layer of a conductivity type different from that of the drain layer, provided on the side of the top surface in the active region;

a channel diffusion layer of the game conductivity type as that of the base diffusion layer, provided on the side of the top surface in the active region, connected to the base diffusion layer; a source diffusion layer of conductivity type different from that of the base diffusion layer, provided on the side of the top surface in the base diffusion layer and on the side of the top surface in the channel diffusion layer; a gate insulation film provided on the surface of at least a part of the channel diffusion layer between the periphery of the source diffusion layer and the periphery of the channel diffusion layer; a gate electrode film provided on the gate insulation film; a drain electrode film electrically connected to the drain layer; and a source electrode film electrically connected to the source diffusion layer, the base diffusion layer and the fixed potential diffusion layer.

In a field effect transistor according to the current invention, a guard ring diffusion layer of a conductivity type different from that of the drain layer may be provided in the drain layer outside the fixed potential diffusion layer in non-contact with the fixed potential diffusion layer such that it surrounds the fixed potential diffusion layer, and the guard ring diffusion layer may be at a floating potential.

The guard ring diffusion layer may be put at a floating potential by not connecting a guard ring electrode to the source electrode, the drain electrode and gate electrode to which a voltage is applied. Alternatively, a metal film in electrical connection to the guard ring diffusion layer may be provided on the guard ring diffusion layer.

Further, a field effect transistor according to the current invention may have a plurality of guard ring diffusion layers in non-contact with each other and may have a configuration in which a guard ring diffusion layer is surrounded by a guard ring diffusion layer located outside thereof.

Furthermore, a field effect transistor according to the invention may have an insulation film provided on the drain layer outside the active region, a gate pad electrically connected to the gate electrode film and an external terminal will be fixed to, provided on the insulation film and a pad diffusion film of a conductivity type different from that of the drain layer, provided in the drain layer directly under the gate pad, and the pad diffusion layer may be connected to the guard ring diffusion layer adjacent to the fixed potential diffusion layer.

The present invention has a configuration as described above in which an active region is surrounded by a fixed potential diffusion layer. The fixed potential diffusion layer is connected to a source electrode, and a part of minority carriers injected in the active region which are present at the periphery of the active region can be efficiently collected. This prevents the minority carriers from concentrating at the periphery of the active region and makes it possible to provide a MOSFET having a high breakdown withstand capacity.

A gate pad is provided outside the fixed potential diffusion layer, and a pad diffusion layer of a conductivity type different from that of a drain layer is formed in the drain layer located under the gate pad. The pad diffusion layer is connected to an innermost guard ring diffusion layer to be put at a floating potential. As a result, the pad diffusion layer serves as a part of the guard ring diffusion layer to provide an increased breakdown voltage.

Since no concentration of minority carriers occurs around an active region, an improved withstand capacity is provided. Since a pad diffusion layer connected to guard ring diffusion layers is provided in a position under a gate pad, expansion of depletion layer is encouraged under the gate pad, which provides an increased breakdown voltage.

The reference numbers represent the following elements: 3,4: MOSFET of the current invention; 5: IGBT of the current invention; 11: drain layer; 12, 19, 19a: base diffusion layer; 13, 13a: channel diffusion layer; 14, 14a: source diffusion layer; 15, 15a: channel region; 16: fixed potential diffusion layer; $17_1$ through $17_4$: guard ring diffusion layer; 18: pad diffusion layer; 21: gate insulation film; 31: gate electrode film; 32: source electrode film; 35: gate pad; 44: insulation film.

DETAILED DESCRIPTION OF THE PREFERRED EMBODIMENTS

Figure 1:
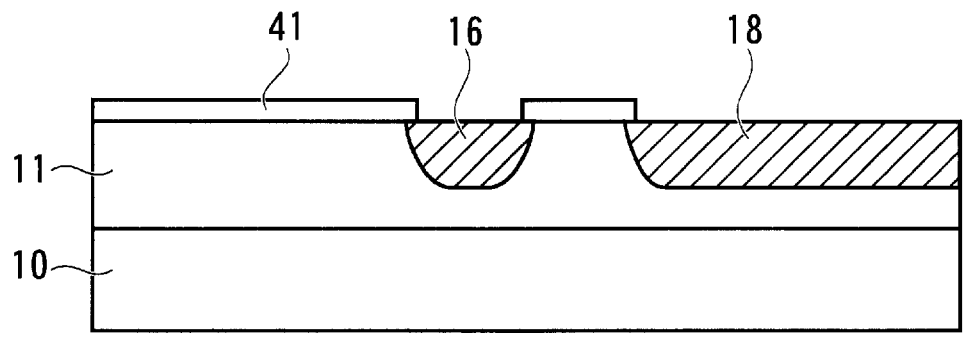
FIG. 1 is a sectional view taken at a manufacturing step to explain a fixed potential diffusion layer and a pad diffusion layer.

Referring to FIG. 1, reference number 11 represents a drain layer which is an n⁻-type silicon epitaxial layer. The drain layer 11 is formed on a surface of a substrate 10 made of an n-type silicon single crystal.

An oxide film 41 having a window constituted by a silicon oxide film is formed on the drain layer 11. A p-type impurity is deeply diffused from the window portion of the oxide film 41.

Figure 8:
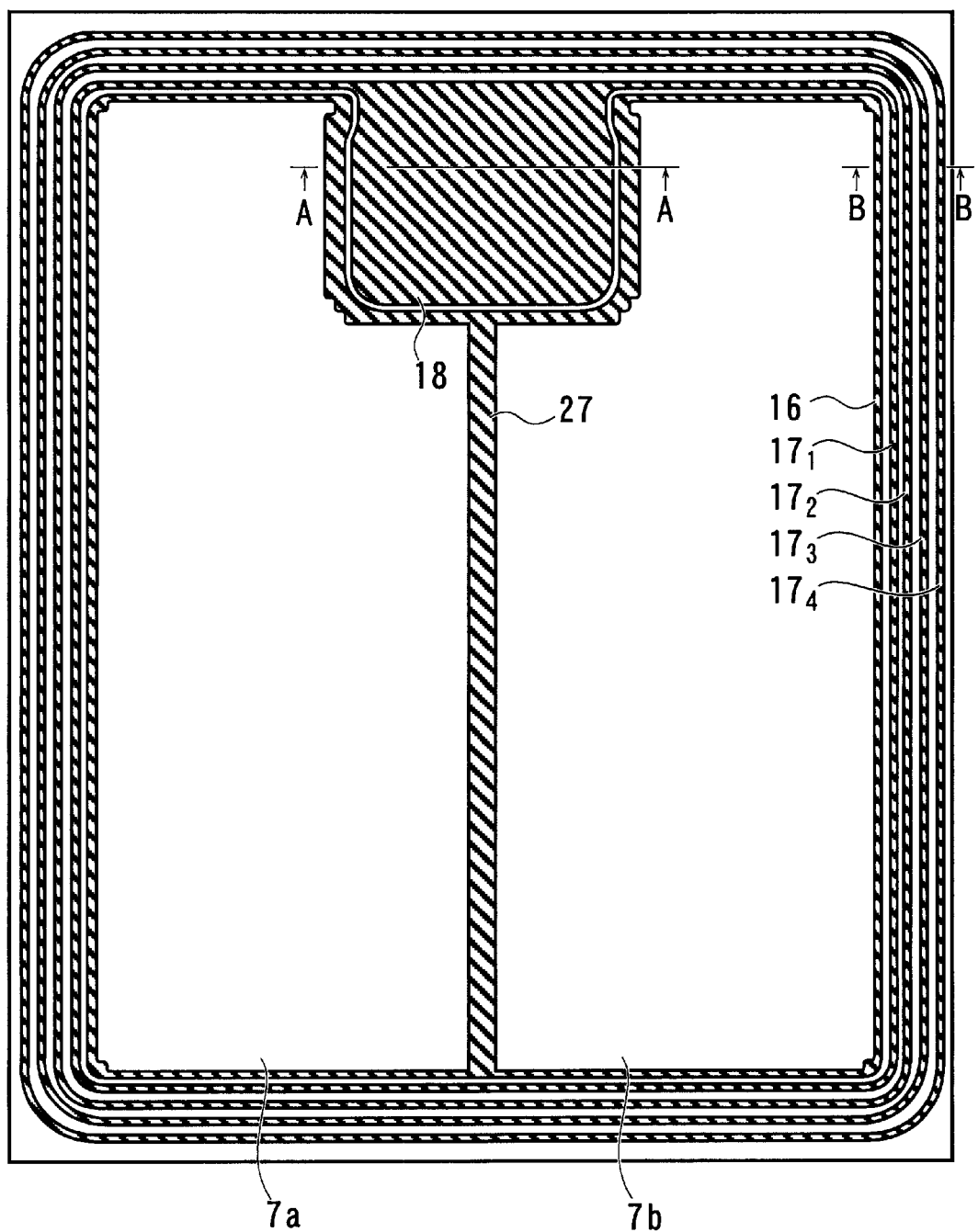
FIG. 8 is a plan view of a guard ring layer, a pad diffusion layer and a fixed diffusion layer to explain an arrangement of the same.

FIG. 8 is a plan view of the drain layer 11. As a result of the deep diffusion of the p-type impurity, there is formed a fixed potential diffusion layer 16 in the form of a ring and four guard ring diffusion layers $17_1$ through $17_4$ surrounding the fixed potential diffusion layer 16. The fixed potential diffusion layer 16 and the guard ring diffusion layers $17_1$ through $17_4$ are spaced from each other.

Figure 5:
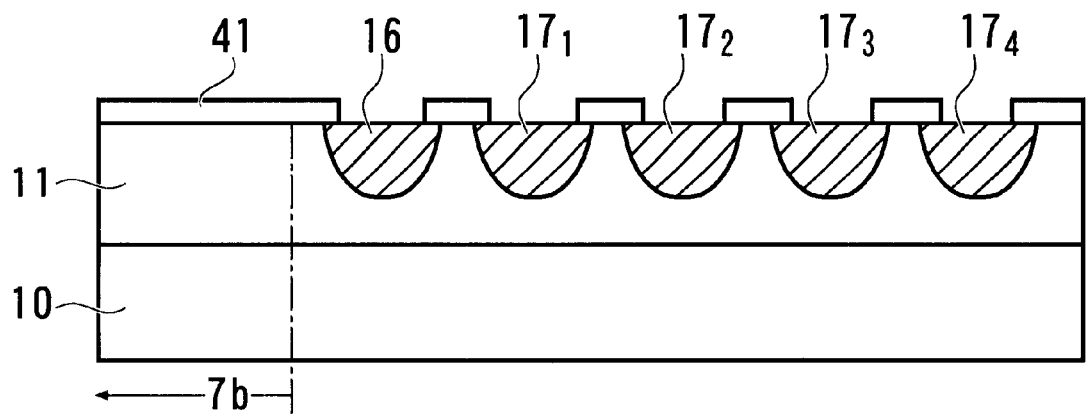
FIG. 5 is a sectional view taken at a manufacturing step to explain a fixed potential diffusion layer and a guard ring diffusion layer.

When the fixed potential diffusion layer 16 and guard ring diffusion layers $17_1$ through $17_4$ are formed, a substantially square pad diffusion layer 18 is also formed. The pad diffusion layer 18 is connected to the guard ring layer $17_1$ which is the innermost layer among the guard ring diffusion layers $17_1$ through $17_4$. FIG. 1 is a sectional view taken along the line A—A in FIG. 8, and FIG. 5 is a sectional view taken along the line B—B in FIG. 8. As shown in FIG. 8, central regions of the fixed potential diffusion layer 16 are connected by a connecting portion 27 which is constituted by a diffusion layer having the same structure as that of the fixed potential diffusion layer 16 and guard ring diffusion layers $17_1$ through $17_4$.

Reference numbers 7a and 7b in FIG. 8 represent an active region which is a portion of the drain layer 11 surrounded by the fixed potential diffusion layer 16. The portion surrounded by the fixed potential diffusion layer 16 is divided by the connecting portion 27 into two active regions 7a and 7b. A base diffusion layer and a channel diffusion layer which will be described layer are formed in the active regions 7a and 7b.

Figure 2:
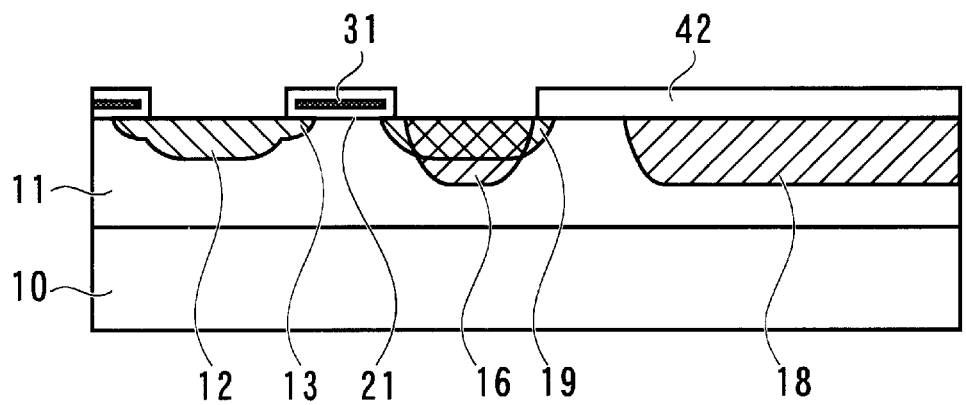
FIG. 2 is a sectional view taken at a manufacturing step to explain a gate electrode film, a base diffusion layer and a channel diffusion layer.

After the fixed potential diffusion layer 16 and guard ring diffusion layers $17_1$ through $17_4$ are formed, as shown in FIG. 2, a gate insulation film 21 which is a silicon oxide film patterned in a predetermined configuration and a gate insulation film 31 which is a metal thin film such as an aluminum thin film patterned in a predetermined configuration are formed in the order listed on a surface of the drain layer 11. A p-type impurity is diffused into the drain layer 11 through window portions of the gate electrode film 31 and gate insulation film 21 in two separate steps to form a base diffusion layer 12 and a channel diffusion layer 13. Reference number 19 represents a base diffusion layer which is formed such that it overlaps a part of the fixed potential diffusion layer 16.

The base diffusion layers 12 and 19 are shallower and less dense than the fixed potential diffusion layer 16 and guard ring diffusion layers $17_1$ through $17_4$, and the channel diffusion layer 13 is shallower and less dense than the base diffusion layers 12 and 19.

The p-type impurity, which forms the channel diffusion layer 13, is diffused to an extent that it exceeds the periphery of the base diffusion layer 12, and the channel diffusion layer 13 is constituted by the region that extends beyond the base diffusion layer 12. The channel diffusion layer 13 is therefore connected to the edge of the base diffusion layer 12.

Figure 3:
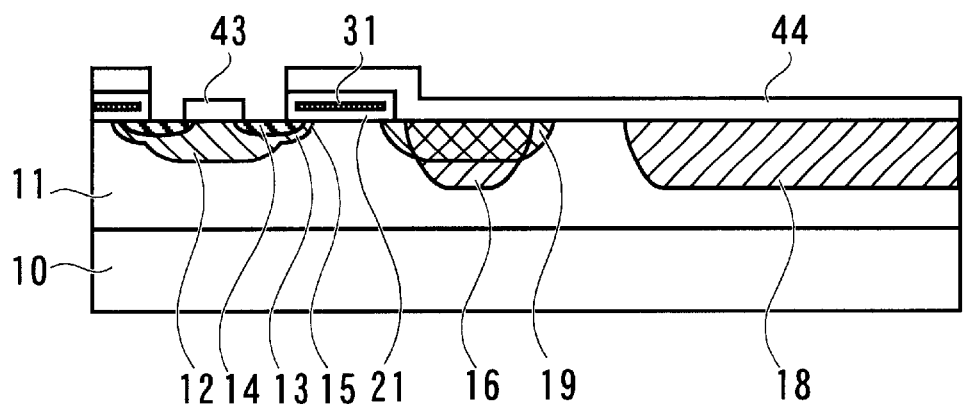
FIG. 3 is a sectional view taken at a manufacturing step to explain a source diffusion layer.

Next, as shown in FIG. 3, an n⁺-type impurity is diffused in a state in which the surface of the base diffusion layer 12 and the surface of the channel diffusion layer 13 in the region thereof connected to the base diffusion layer 12 are exposed, while in a central surface of the base diffusion layer 12, the fixed voltage diffusion layer 16, the surface of the guard ring diffusion layers $17_1$ through $17_4$, and the surface of the pad diffusion layer 18 are masked with a patterned oxide film 43. Then, an n+-type source diffusion layer 14 is formed on the surface of a p-type diffusion region formed by the base diffusion layer 12 and channel diffusion layer 13.

A channel region 15 is constituted by a p-type diffusion region between an end of the surface of the source diffusion layer 14 and an end of the surface of the channel diffusion layer 13.

Figure 4:
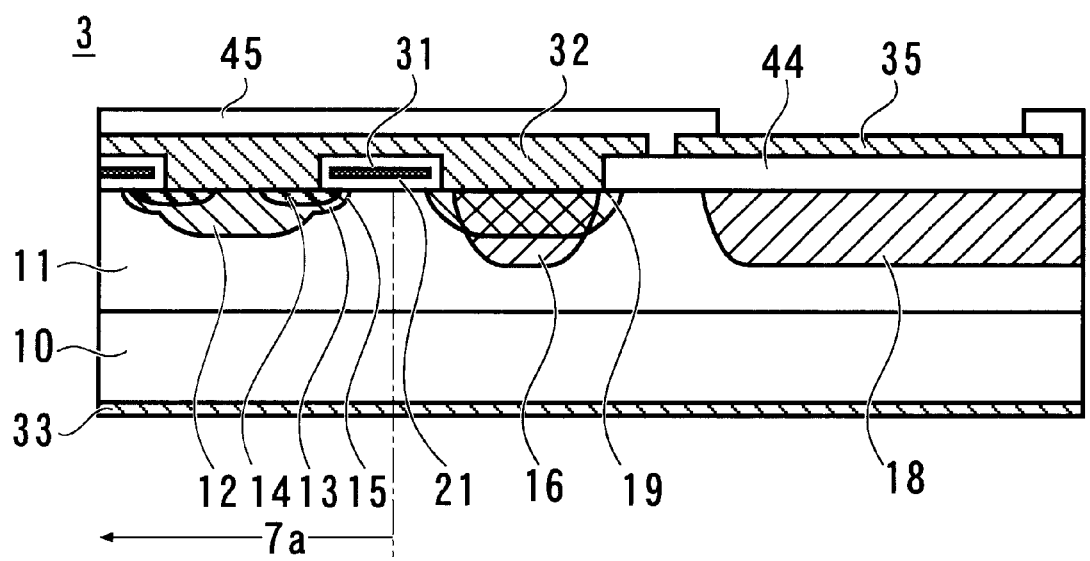
FIG. 4 is a sectional view to explain a MOSFET according to the invention in which a source electrode film and a gate pad have already been formed.

The oxide film 43 on the base diffusion layer 12 is then removed to expose the source diffusion layer 14 and base diffusion layer 12, and a metal thin film is formed. The metal thin film constitutes a source electrode film 32 as shown in FIG. 4.

Figure 9:
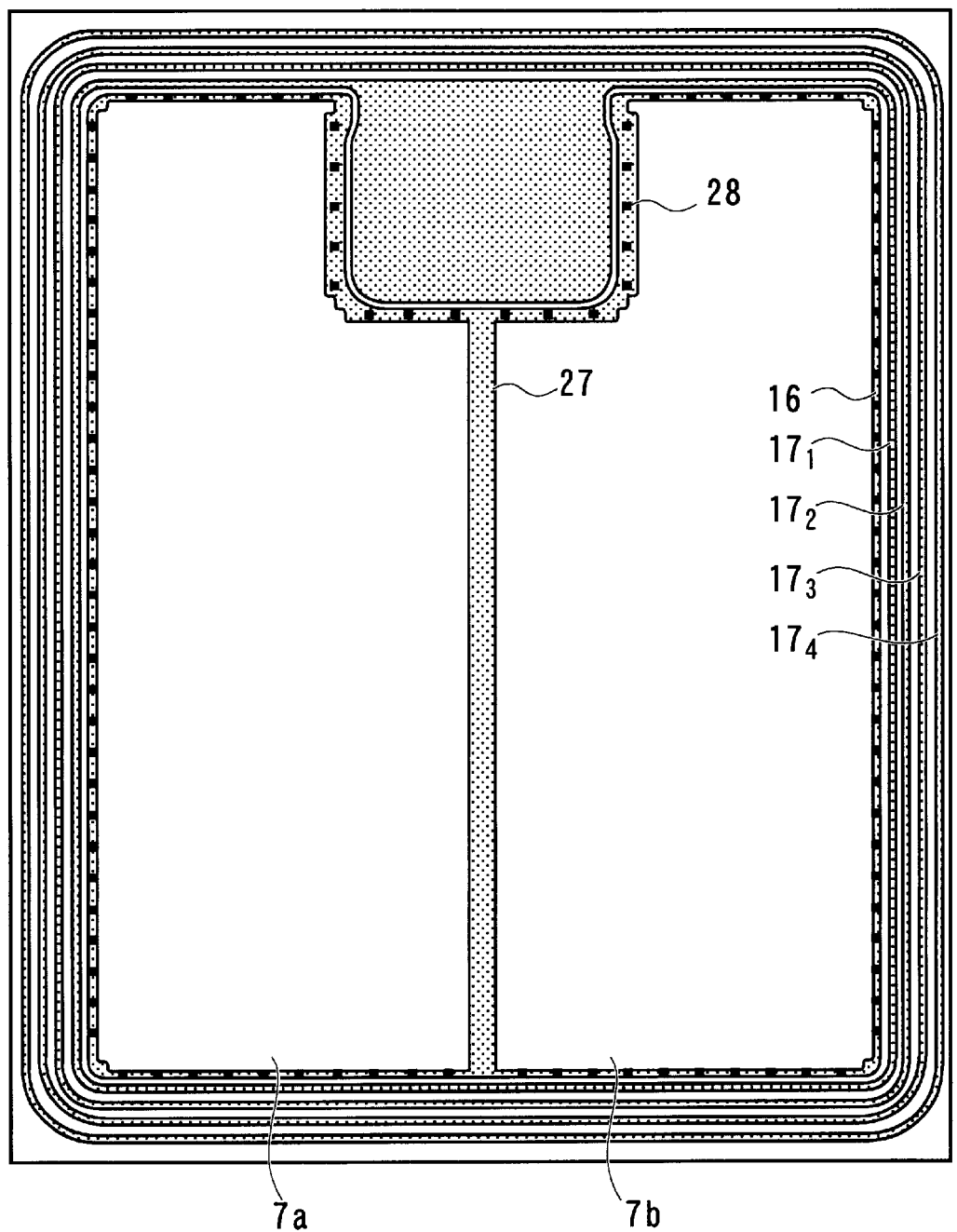
FIG. 9 illustrates a positional relationship between a ground potential diffusion layer and a window portion.
Figure 10:
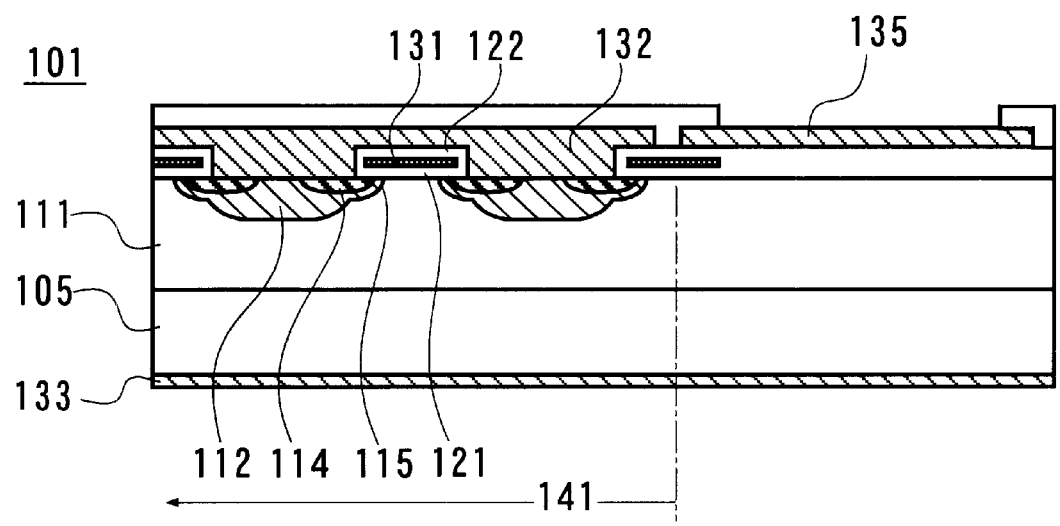
FIG. 10 illustrates a MOSFET according to the prior art.

When window portions are provided at this time on a surface of the base diffusion layer 19 which has been diffused in the fixed potential diffusion layer 16 in an overlapping relationship to expose the surface of the base diffusion layer 19 on the bottom of the window portions, a metal thin film is also formed on the surface of the fixed potential diffusion layer 16. Reference number 28 in FIG. 9 represents a plurality of such window portions provided in positions above the fixed potential diffusion layer 16 at substantially equal intervals.

The metal thin film is electrically connected to the source electrode film 32 instead of being isolated therefrom. The fixed potential diffusion layer 16 is electrically connected to the base diffusion layer 12 and source diffusion layer 14. The source electrode film 32 is connected to a ground potential. Then, the fixed potential diffusion layer 16 is also connected to the ground potential.

The guard ring diffusion layers $17_1$ through $17_4$ and the pad diffusion layer 18 are not exposed and are not connected to the source electrode film 32.

When the source electrode film 32 is formed, a gate pad 35 having a large area is formed on a surface of an insulation film 44 on the drain layer 11 using the metal thin film that forms the source electrode film 32. The gate pad 35 is insulated by the insulation film 44 from the drain layer 11 and the diffusion layers formed in the drain layer 11 and is connected to only the gate electrode film 31. A silicon oxide film is used here as the insulation film 44.

Next, a protective film 45 is formed with a surface of the gate pad 35 and a surface of a source pad (not shown) connected to the source electrode film 32 exposed. Finally, a metal thin film is formed on the bottom surface of the drain layer 11, and the metal thin film constitutes a drain electrode film 33 to complete a MOSFET 3.

When the MOSFET 3 is used, a positive voltage is applied to the gate electrode film 31 with the source electrode film 32 grounded and a positive voltage applied to the drain electrode film 33, the surface of the channel region 15 is inverted to allow a current to flow from the drain electrode film 33 to the source electrode film 32.

When the ground voltage is applied to the gate electrode film 31 in this state, the inversion layer on the surface of the channel region 15 vanishes to cut off the current.

In the MOSFET 3, when a voltage higher than that of the drain electrode film 33 is applied to the source electrode film 32, a parasitic pn diode formed by the drain layer 11, base diffusion layer 12 and channel diffusion layer 13 is forward-biased, and a current flows through the parasitic pn diode. The current causes injection of minority carriers into the drain layer 11.

When the voltage between the source electrode film 32 and drain electrode film 33 is inverted in this state, the injected minority carriers flow into the base diffusion layer 12 and channel diffusion layer 13 connected to the source electrode film 32.

While the minority carriers tend to concentrate at the outermost base diffusion layer 12 and channel diffusion layer 15 at edges of the active regions 7a and 7b, in the MOSFET 3, since the active regions 7a and 7b are surrounded by the fixed potential diffusion layer 16 which is connected to the source electrode film 32, the minority carriers flow into the fixed potential diffusion layer 16 and hence no concentration occurs.

Further, the guard ring diffusion layers $17_1$ through $17_4$ and pad diffusion layer 18 of the MOSFET 3 are not connected to the source electrode film 32, gate electrode film 31 and drain electrode film 33 and are provided outside the fixed potential diffusion layer 16 which is at a floating potential. This encourages the expansion of a depletion layer from the base diffusion layer 12 when a high voltage is applied to the drain electrode film 33 with the source electrode film 32 grounded, which provides a high breakdown voltage.

Figure 6:
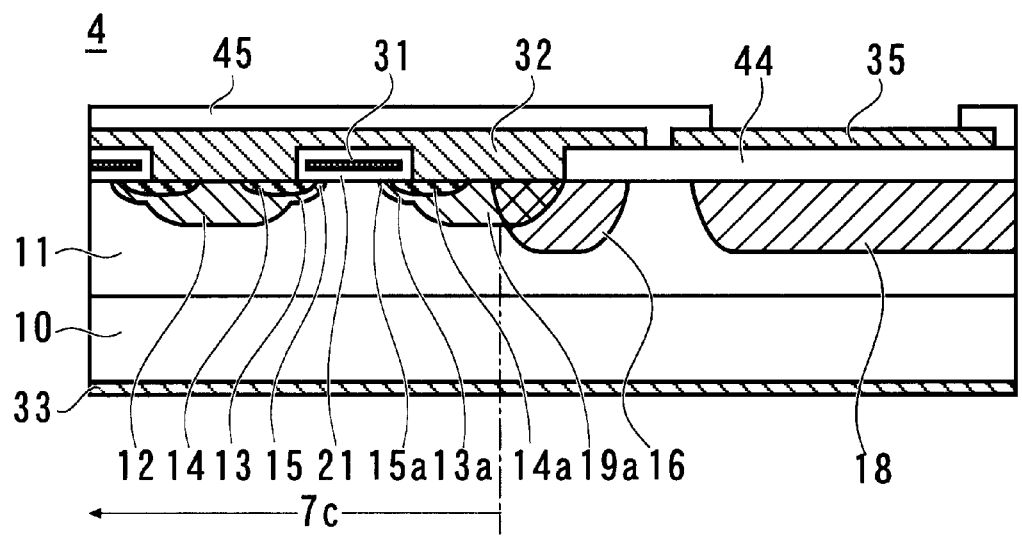
FIG. 6 is a sectional view to explain an example of another MOSFET according to the current invention.

While the source diffusion layer 14 is not formed in the base diffusion layer 19 connected to the fixed potential diffusion layer 16 in the above-described embodiment, a MOSFET 4 shown in FIG. 6 has a base diffusion layer 19a which is connected to a fixed potential diffusion layer 16 at one end thereof. A channel diffusion layer 13a is connected to a base diffusion layer 19a, and a source diffusion layer 14a is formed on a surface of the base diffusion layer 19a and channel diffusion layer 13a.

A channel region 15a is formed between an end of the source diffusion layer 14a and an end of the channel diffusion layer 13a, and a gate insulation film 21 and a gate electrode film 31 are provided on the surface thereof. In such a MOSFET 4, a part of the base diffusion layer 19a connected to the fixed potential diffusion layer 16 serves as an active region which contributes to the operation of the MOSFET.

Minority carriers at an end of an active region 7c flow into the fixed potential diffusion layer 16 also causing no concentration in this MOSFET 4.

Parts of the MOSFET 4 identical to those in the MOSFET 3 shown in FIG. 4 are indicated by like reference numbers.

Figure 7:
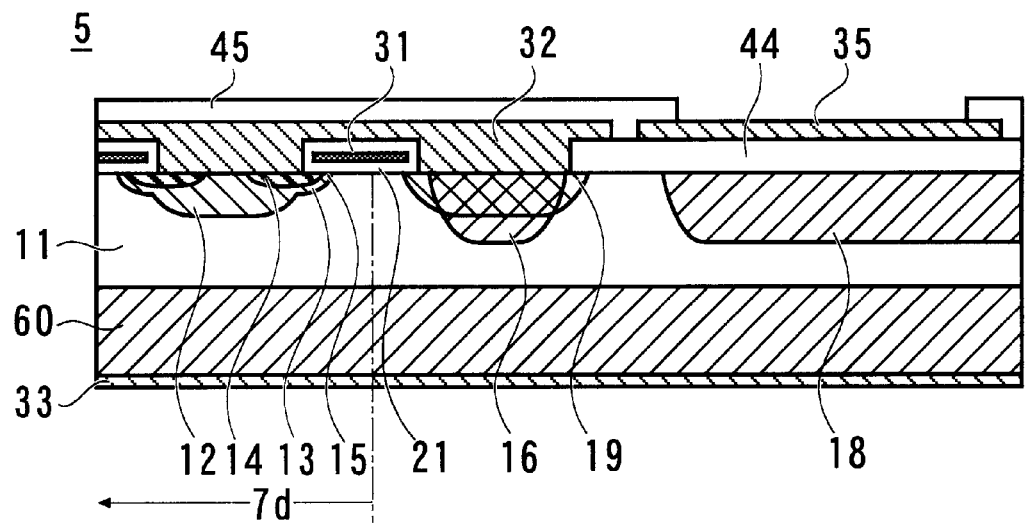
FIG. 7 is a sectional view to explain an example of an IGBT according to the current invention.

Reference number 5 in FIG. 7 represents an IGBT which is different from the MOSFET 3 in FIG. 4 in that it has a p-type silicon substrate 60 instead of a p-type silicon substrate 10.

Parts of the IGBT identical to those of the MOSFET 3 in FIG. 3 are indicated by like reference numbers and will not be described.

The IGBT 5 has a greater number of guard ring diffusion layers to provide an improved withstand voltage. When it is put in a conducting state with a ground potential applied to a source electrode film 32 and a positive voltage applied to a drain electrode film 33, minority carriers are injected into a drain layer 11 from the a $p^+$-type silicon substrate 60, and it is considered that a part of the minority carriers which have been injected at an edge of an active region 7d flow into a fixed potential diffusion layer 16 causing no concentration.

While the fixed potential diffusion layer in the above embodiments is connected to a ground potential, it may be connected to the same potential as the source electrode on the chip. In the case of a p-channel type MOSFET or IGBT, the drain region is a p-type silicon single crystal, and the ground potential diffusion layer and guard ring diffusion layers are n-type. The ground potential diffusion layer may be connected to the same potential as the source electrode also in this case.

What is claimed is:

1. A field effect transistor comprising:
   a substrate of one conductivity type;
   a drain layer of the same conductivity type as that of said substrate, provided on said substrate;
   a fixed potential diffusion layer of a conductivity type different from that of said drain layer, in the form of a ring provided inside said drain layer and on the side of a top surface thereof;
   an active region which is a part of said drain layer and which is a region located inside said fixed potential diffusion layer in said drain layer;
   a base diffusion layer of a conductivity type different from that of said drain layer, provided on the side of the top surface in said active region;
   a channel diffusion layer of the same conductivity type as that of said base diffusion layer, provided on the side of the top surface in said active region, connected to said base diffusion layer;
   a source diffusion layer of conductivity type different from that of said base diffusion layer, provided on the side of the top surface in said base diffusion and on the side of the top surface in said channel diffusion layer;
   a gate insulation film provided on the surface of at least a part of said channel diffusion layer between the periphery of said source diffusion layer and the periphery of said channel diffusion layer;
   a gate electrode film provided on said gate insulation film;
   a drain electrode film electrically connected to said drain layer; and
   a source electrode film electrically connected to said source diffusion layer, said base diffusion layer and said fixed potential diffusion layer, and wherein
      an insulation film provided on said drain layer outside said active region,
      a gate pad connected to said gate electrode film and to an external terminal, provided on said insulation film,
      a pad diffusion layer of a conductivity type different from that of said drain layer, provided in said drain layer directly under said gate pad, wherein said pad diffusion layer and said fixed potential diffusion layer are provided in non-contact with each other.

2. A field effect transistor according to claim 1, further comprising at least a guard ring diffusion layer of a conductivity type different from that of said drain layer, provided in said drain layer outside said fixed potential diffusion layer in non-contact with said fixed potential diffusion layer such that it surrounds said fixed potential diffusion layer, wherein said guard ring diffusion layer is at a floating potential.

3. A field effect transistor according to claim 2, wherein a plurality of said guard ring diffusion layers are provided and separated from each other, and wherein at least one of said guard ring diffusion layers is surrounded by at least another one of said guard ring diffusion layers located outside thereof.

4. The field effect transistor according to claim 3, wherein said pad diffusion layer is connected to said guard ring diffusion layer next to said fixed potential diffusion layer.

5. The field effect transistor according to claim 1, wherein a depth of said fixed potential diffusion layer is greater than that of said base diffusion layer.

6. The field effect transistor according to claim 5, wherein said base diffusion layer is connected to said fixed potential diffusion layer.

7. The field effect transistor according to claim 6, wherein a depth of said channel region is smaller than that of said base diffusion layer.

8. The field effect transistor according to claim 2, wherein a depth of said guard ring diffusion layer is greater than that of said base diffusion layer.

9. The field effect transistor according to claim 8, wherein a depth of said guard ring diffusion layer and that of said fixed potential diffusion layer are the same.

* * * * *